(12) United States Patent
Chen et al.

(10) Patent No.: US 12,033,860 B2
(45) Date of Patent: Jul. 9, 2024

(54) SOFT ASHING PROCESS FOR FORMING PROTECTIVE LAYER ON CONDUCTIVE CAP LAYER OF SEMICONDUCTOR DEVICE

(71) Applicant: TAIWAN SEMICONDUCTOR MANUFACTURING COMPANY, LTD., Hsinchu (TW)

(72) Inventors: Guan-Xuan Chen, Hsinchu (TW); Sheng-Liang Pan, Hsinchu (TW); Chia-Yang Hung, Hsinchu (TW); Po-Chuan Wang, Hsinchu (TW); Huan-Just Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 151 days.

(21) Appl. No.: 17/377,864

(22) Filed: Jul. 16, 2021

(65) Prior Publication Data

US 2023/0014509 A1 Jan. 19, 2023

(51) Int. Cl.
*H01L 21/28* (2006.01)
*H01L 21/02* (2006.01)
*H01L 21/768* (2006.01)

(52) U.S. Cl.
CPC .. *H01L 21/28247* (2013.01); *H01L 21/76877* (2013.01); *H01L 21/76897* (2013.01); *H01L 21/02063* (2013.01); *H01L 21/02175* (2013.01); *H01L 21/02194* (2013.01); *H01L 21/02332* (2013.01); *H01L 21/0234* (2013.01)

(58) Field of Classification Search
CPC ......... H01L 21/28247; H01L 21/76877; H01L 21/76897; H01L 21/02175; H01L 21/02194; H01L 21/02332; H01L 21/0234
See application file for complete search history.

(56) References Cited

U.S. PATENT DOCUMENTS

| | | | |
|---|---|---|---|
| 8,232,638 B2 * | 7/2012 | Ma | H01L 21/7685 257/734 |
| 2010/0151676 A1 * | 6/2010 | Ritchie | C23C 16/34 257/E21.477 |

OTHER PUBLICATIONS

Perez-Romo et al., "Phosphorus-Doped Tungsten Oxynitrides: Synthesis, Characterization, and Catalytic Behavior in Propene Hydrogenation and n-Heptane Isomerization", Journal of Catalysis, 205, 191-198 (Year: 2002).*

* cited by examiner

*Primary Examiner* — Jay C Kim
*Assistant Examiner* — Woo K Lee
(74) *Attorney, Agent, or Firm* — Birch, Stewart, Kolasch & Birch, LLP

(57) ABSTRACT

A method for making a semiconductor device includes patterning at least one dielectric layer disposed over a conductive cap layer to form a via opening penetrating through the at least one dielectric layer to expose the conductive cap layer and to form a top portion of the conductive cap layer into a metal oxide layer; converting the metal oxide layer to a metal oxynitride layer by a soft ashing process using a processing gas containing nitrogen gas; removing the metal oxynitride layer from a remaining portion of the conductive cap layer; and forming a via contact in the via opening to electrically connect the remaining portion of the conductive cap layer.

19 Claims, 10 Drawing Sheets

SOFT ASHING PROCESS FOR FORMING PROTECTIVE LAYER ON CONDUCTIVE CAP LAYER OF SEMICONDUCTOR DEVICE

BACKGROUND

In the manufacture of a semiconductor device, an electronic component such as a transistor makes contact with an upper conductive layer of the semiconductor device through a via contact in an insulating layer that is disposed between the electronic component and the upper conductive layer. A via opening is formed in the insulating layer by processes including etching, soft ashing, wet cleaning, and the like, so that a conductive material may be filled in the via opening to form the via contact.

A top portion of a metal layer used as a conductive cap layer formed on a conductive feature (e.g., a metal gate) of the electronic component is liable to be oxidized to form a metal oxide layer due to that an oxygen-containing etchant gas is used in the etching process for forming the via opening, that the metal layer is exposed to atmosphere after the etching process, and/or that the soft ashing process is conducted using oxygen gas. Since the metal oxide layer is fragile and easily stripped during the wet cleaning process, a significant metal loss of the metal oxide layer might occur after the wet cleaning process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
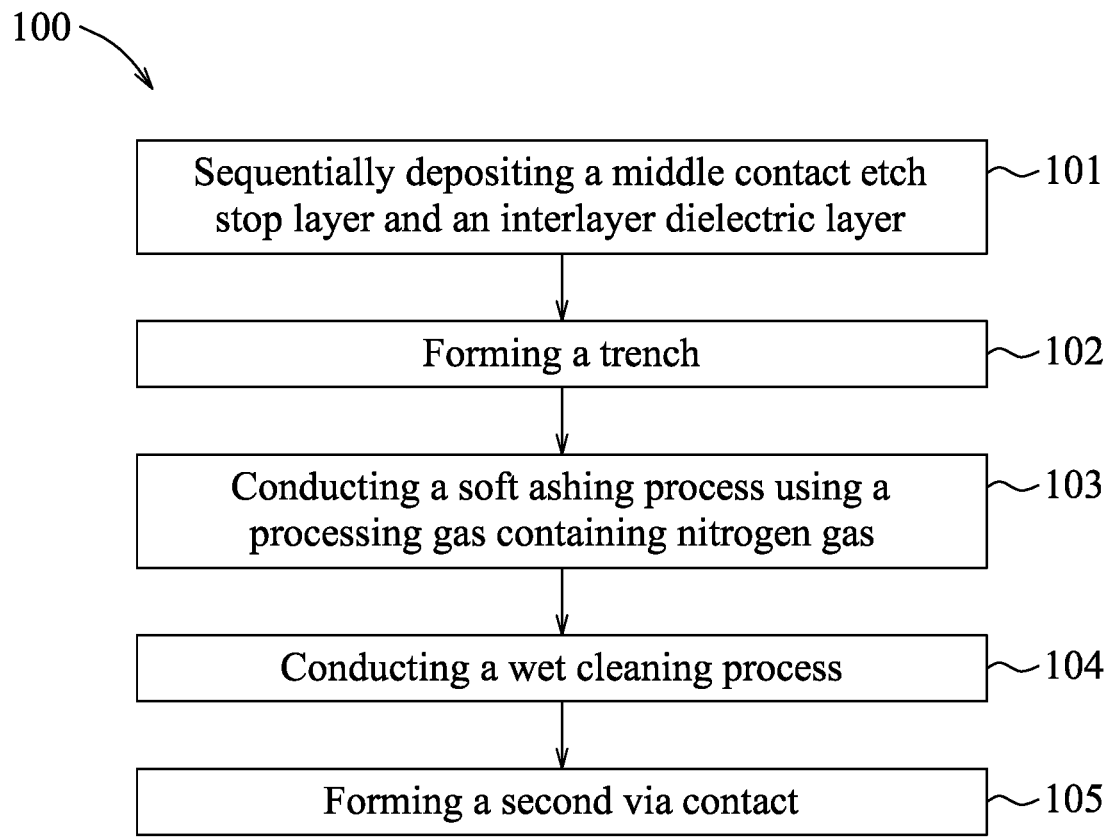
FIG. 1 is a flow diagram illustrating a method for manufacturing a semiconductor device in accordance with some embodiments.
Figure 2:
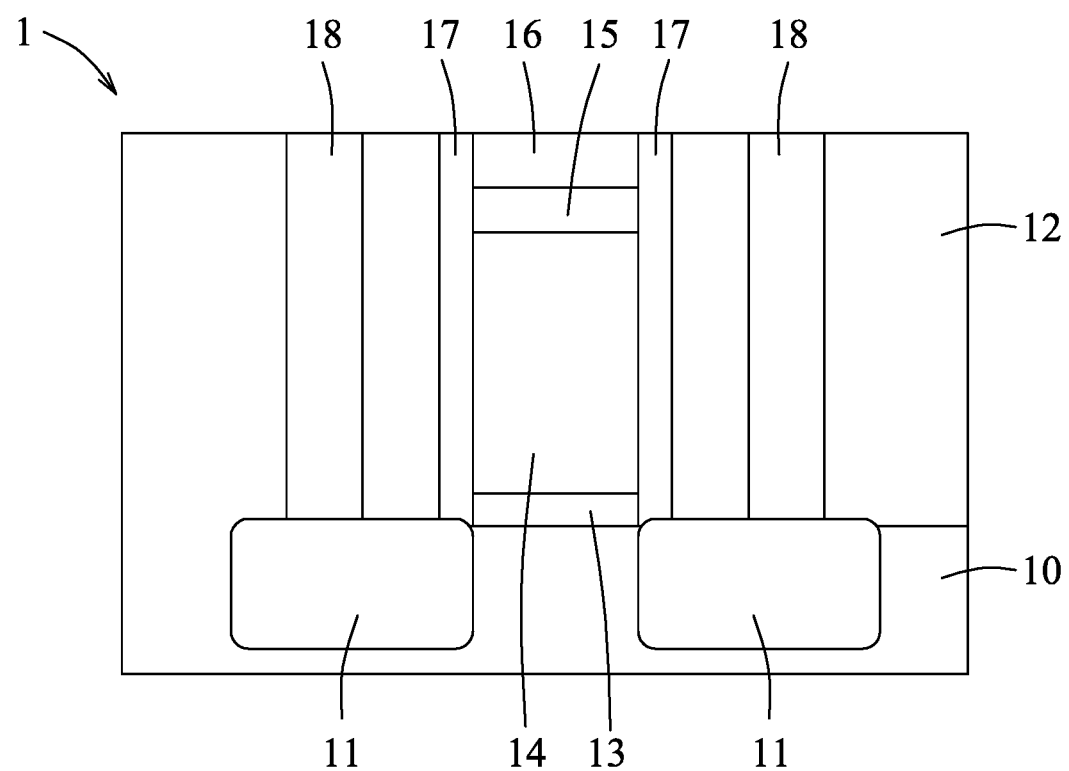
FIGS. 2 to 6 illustrate schematic views showing intermediate stages of the method depicted in FIG. 1.
Figure 3:
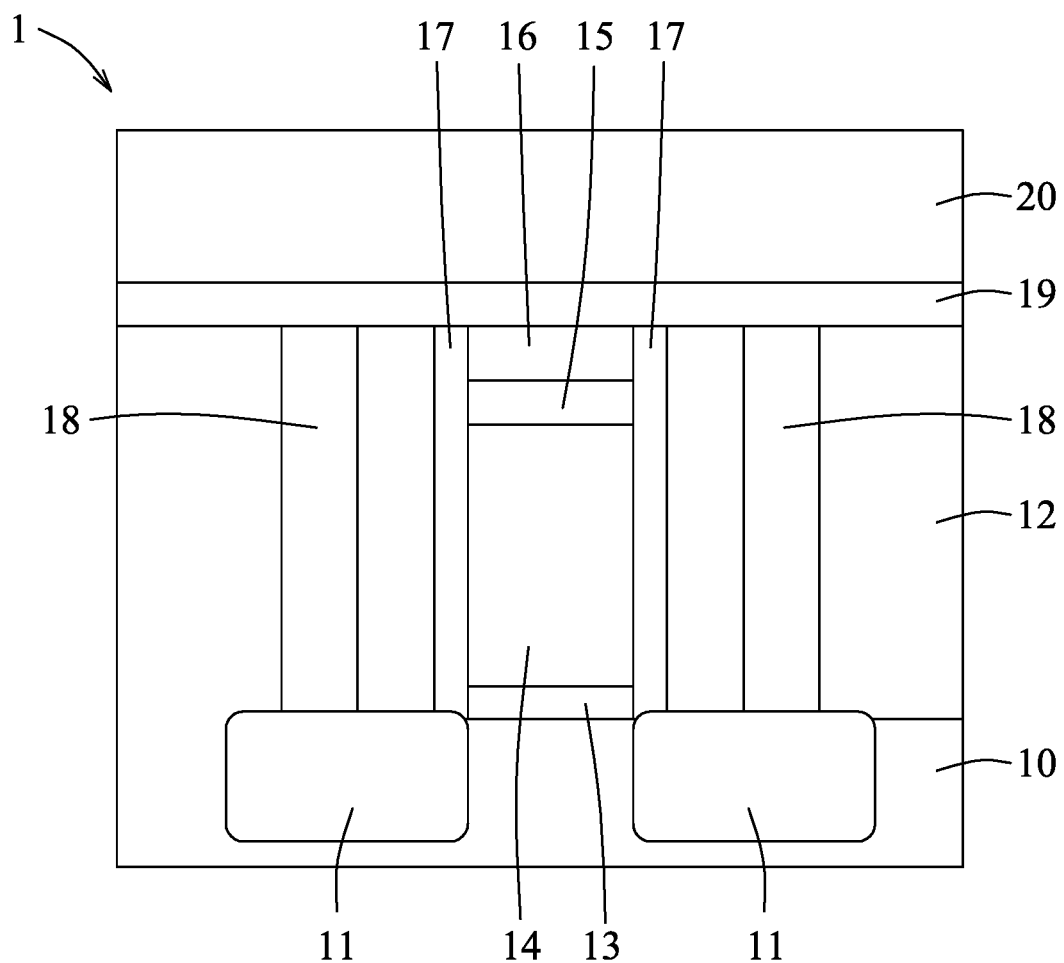
Figure 4:
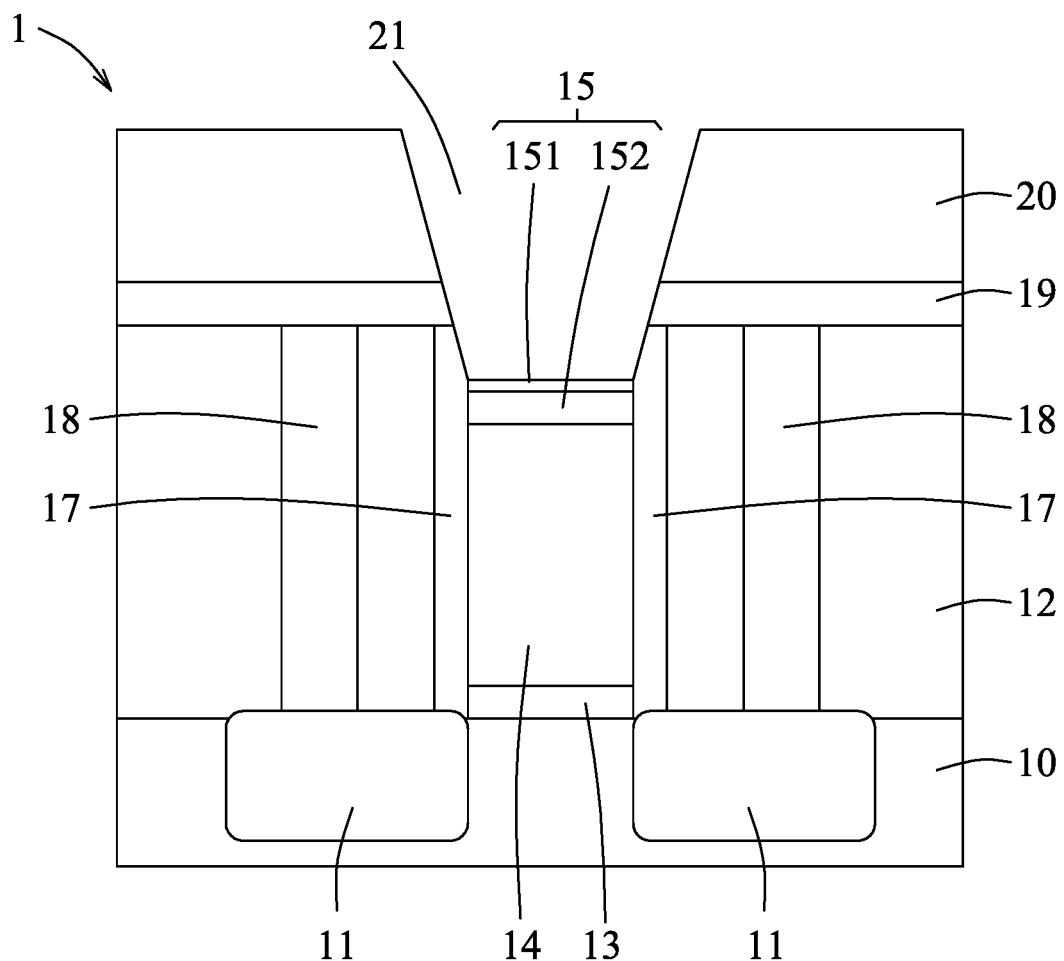
Figure 5:
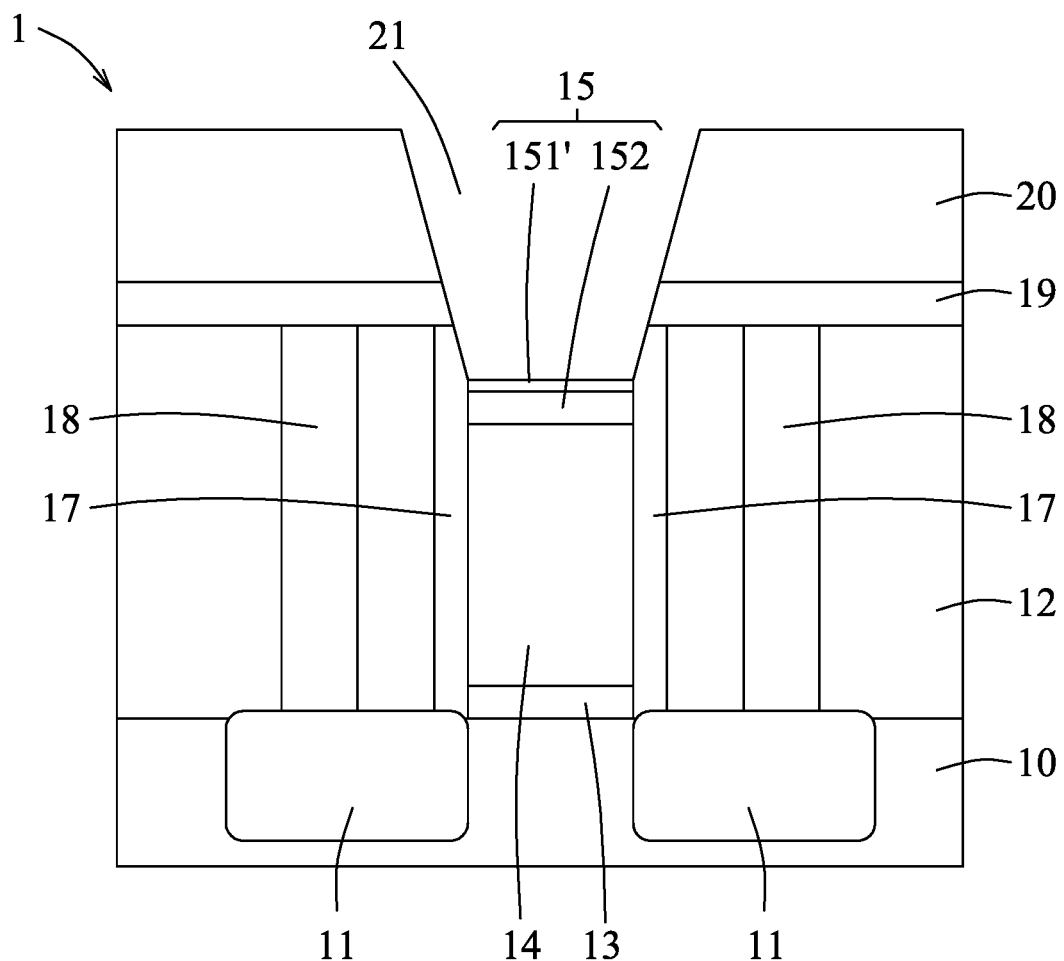
Figure 6:
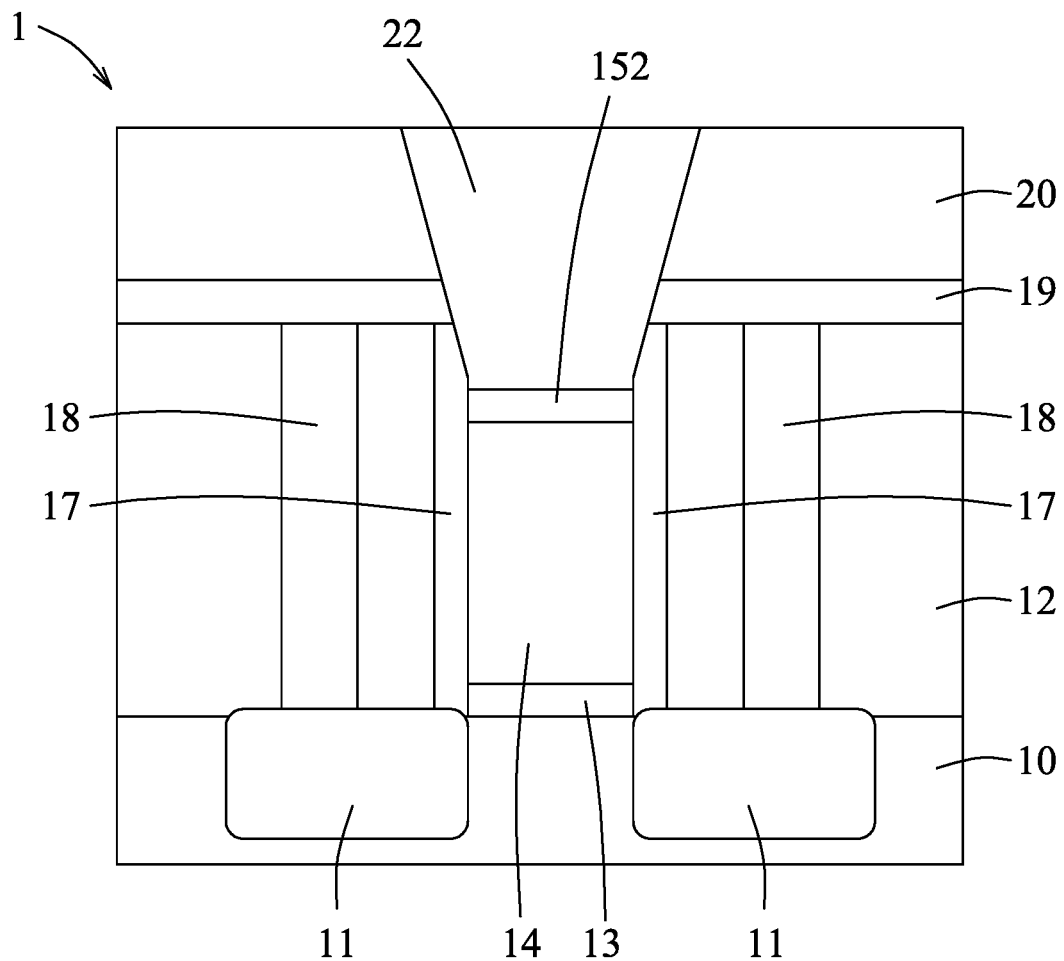

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "below," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a method 100 for manufacturing a semiconductor device in accordance with some embodiments. FIGS. 2 to 6 illustrate schematic views of a semiconductor device 1 during various stages of the method 100 shown in FIG. 1. The method 100 and the semiconductor device 1 are collectively described below. However, additional steps can be provided before, after or during the various stages of the method 100, and some of the steps described herein may be replaced by other steps or be eliminated. Similarly, further additional features may be present in the semiconductor device 1, and/or features present may be replaced or eliminated in additional embodiments.

Referring to FIG. 1, the method 100 begins at block 101, where a middle contact etch stop layer (MCESL) and an interlayer dielectric (ILD) layer are deposited sequentially. Referring to the example illustrated in FIG. 2, a semiconductor device 1 at an intermediate stage of the method 100 in accordance with some embodiments includes a semiconductor substrate 10, source/drain (S/D) regions 11 disposed in the semiconductor substrate 10, a first ILD layer 12 disposed on the semiconductor substrate 10 and the S/D regions 11, a gate dielectric 13 disposed on the semiconductor substrate 10 and between the S/D regions 11, a metal gate 14 inserted in the first ILD layer 12 and disposed on the gate dielectric 13 and between the S/D regions 11, a conductive cap layer 15 disposed on the metal gate 14, a self-aligned contact (SAC) layer 16 disposed on the conductive cap layer 10, sidewall spacers 17 disposed in the first ILD layer 12 to laterally cover the gate dielectric 13, the metal gate 14, the conductive cap layer 15, and the SAC layer 16, and first via contacts 18 penetrated through the first ILD layer 12 to electrically connect the S/D regions 11, respectively. Referring to the example illustrated in FIG. 3, a MCESL 19 is deposited on the first ILD 12 to cover the first via contacts 18, the sidewall spacers 17, and the SAC layer 16, and a second ILD layer 20 is then deposited on the MCESL 19.

In some embodiments, the semiconductor substrate 10 may include, for example, but not limited to, an elemental semiconductor or a compound semiconductor. An elemental semiconductor includes a single species of atoms, such as silicon (Si) or germanium (Ge) in column XIV of the periodic table, and may be in crystal, polycrystalline, or an amorphous structure. Other suitable materials are within the contemplated scope of the present disclosure. A compound semiconductor includes two or more elements, and examples thereof may include, but not limited to, silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and gallium indium arsenide phosphide (GaInAsP). Other suitable materials are within the contemplated scope of the present disclosure. The compound semiconductor may have a gradient feature in which the compositional ratio thereof changes from one location to another location in the compound semiconductor. The compound semiconductor may be formed over a silicon substrate. The compound semiconductor may be strained. In some embodiments, the semiconductor substrate 10 may include a multilayer compound semiconductor structure. In some embodiments, the semiconductor substrate 10 may be a semiconductor on insulator (SOI) (e.g., silicon germanium on insulator (SGOI)). Generally, an SOI substrate includes a layer of a semiconductor material such as epitaxial silicon, germanium, silicon germanium, or combinations thereof. Other suitable materials are within the contemplated scope of the present disclosure. The SOI substrate may be doped with a P-type dopant, for example, but not limited to, boron (Br), aluminum (Al), or gallium (Ga). Other suitable materials are within the contemplated scope of the present disclosure. Alternatively, the SOI substrate may be doped with an N-type dopant, for example, but not limited to, nitrogen (N), phosphorous (P), or arsenic (As). Other suitable materials are within the contemplated scope of the present disclosure. In some embodiments, the semiconductor substrate 10 may further include various active regions, for example, the active regions configured for an N-type metal oxide semiconductor transistor device (NMOS) or the active regions configured for a P-type metal oxide semiconductor transistor device (PMOS).

In some embodiments, the S/D regions 11 may be formed by epitaxially growing a layer of a semiconductor material using a selective epitaxial growth (SEG) process. The S/D regions 11 may be, for example, but not limited to, crystalline silicon (or other suitable semiconductor materials) in-situ doped with a P-type impurity during the SEG process, so as to form P-type S/D regions for PMOS transistors. The P-type impurity may be, for example, but not limited to, boron, aluminum, gallium, indium, $BF_2$, other suitable materials, or combinations thereof. The S/D regions 11 may include one or multiple layers of the semiconductor material. In some embodiments, the S/D regions 11 may be fabricated by forming a SiGe alloy layer through the SEG process and forming a Si cap layer on top of the SiGe alloy layer, followed by implanting a P-type light doping grain (for example, but not limited to, boron, aluminum, gallium, indium, $BF_2$, other suitable materials, or combinations thereof) to form the P-type S/D regions. In some embodiments, the S/D regions 11 may be, for example, but not limited to, crystalline silicon (or other suitable semiconductor materials) in-situ doped with an N-type impurity during the SEG process, so as to form N-type S/D regions for NMOS transistors. The N-type impurity may be, for example, but not limited to, phosphorous, nitrogen, arsenic, antimony, other suitable materials, or combinations thereof. In some embodiments, the S/D regions 11 may be fabricated by forming a SiGe alloy layer through the SEG process and forming a Si cap layer on top of the SiGe alloy layer, followed by implanting an N-type light doping drain (for example, but not limited to, phosphorous, nitrogen, arsenic, antimony, other suitable materials, or combinations thereof) to form the N-type S/D regions.

In some embodiments, the first ILD layer 12 may include dielectric materials, such as silicon oxide, silicon nitride, silicon oxynitride, spin-on glass (SOG), amorphous fluorinated carbon, fluorinated silica glass (FSG), carbon doped silicon oxide (e.g., SiCOH), Black Diamond® (Applied Materials Inc., Santa Clara, Calif.), Xerogel, Aerogel, polyimide, Parylene, BCB (bis-benzocyclobutenes), Flare, SiLK (Dow Chemical Co., Midland, Mich.), non-porous materials, porous materials, or combinations thereof. In some embodiments, the first ILS layer 12 may include a high density plasma (HDP) dielectric material (e.g., HDP oxide), a high aspect ratio process (HARP) dielectric material (e.g., HARP oxide), or a combination thereof. In some embodiments, the first ILD layer 12 may be a planarized dielectric film. The first ILD layer 12 may be formed by a suitable deposition process known to those skilled in the art of semiconductor fabrication, for example, but not limited to, chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), or low-pressure chemical vapor deposition (LPCVD).

In some embodiments, the gate dielectric 13 may be a high-k dielectric layer. In some embodiments, the gate dielectric 13 may include hafnium oxide (HfO), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, metal oxynitrides, metal aluminates, transition metal nitrides, transition metal silicates, transition metal oxides, silicon oxide, silicon nitride, silicon oxynitride, zirconium silicate, zirconium aluminate, other suitable high-k dielectric materials, or combinations thereof. Examples of metal oxides for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu or mixtures thereof. An interfacial layer (not shown) may be disposed below the gate dielectric 13 to reduce damage between the gate dielectric 13 and the semiconductor substrate 10. The interfacial layer may comprise silicon oxide.

In some embodiments, the metal gate 14 may include several layers, for example, but not limited to, a blocking/wetting layer, a work function layer, and a conductive layer (now shown). The blocking/wetting layer prevents or reduces metal impurities from penetrating into any dielectric layers (for example, the gate dielectric 13) disposed below the blocking/wetting layer; and also provides desirable interface duality between the blocking/wetting layer and any material layer formed over the blocking/wetting; layer. In some embodiments, the blocking/wetting layer includes, for example, but not limited to, titanium aluminum nitride (TiAlN), other suitable metal nitrides, titanium aluminum carbonitride (TiAlCN), other suitable metal carbonitrides, or combinations thereof. The work function layer includes a material which is used to tune some work function values of the metal gate 14. In some embodiments, the work function layer may include titanium aluminum carbonitride which has a composition different from that of the titanium aluminum carbonitride of the blocking/wetting layer. In some embodiments, the conductive layer includes aluminum, copper, tungsten, a metal alloy, a metal silicide, other conductive materials, or combinations thereof.

The conductive cap layer 15 may include any suitable conductive material. In some embodiments, the conductive cap layer 15 may include a metal (for example, but not limited to, tungsten (W), cobalt (Co), or other suitable metals) or a metal alloy (for example, but not limited to, cobalt tungsten (CoW) or other suitable metal alloys).

In some embodiments, the SAC layer 16 includes silicon nitride, silicon nitride doped with carbon, silicon oxide, silicon oxynitride, silicon oxynitride doped with carbon, amorphous carbon material, silicon carbide, other nitride materials, other carbide materials, aluminum oxide, other oxide materials, other metal oxides, boron nitride, boron carbide, and other low-k dielectric materials or low-k dielectric materials doped with one or more of carbon, nitrogen, and hydrogen, or other suitable materials. Composition of the SAC layer 16 may be selected based upon etching selectivity to one or more additional features of the semiconductor device 1.

In some embodiments, the sidewall spacers 17 may be formed by conformally depositing a spacer layer and etching away horizontal portions of the spacer layer using a dry etching process (for example, but not limited to, anisotropically etching) to form the sidewall spacers 17, which laterally covers the gate dielectric 13, the metal gate 14, the conductive cap layer 15, and the SAC layer 16. The conformal deposition may be conducted by a suitable deposition process known to those skilled in the art of semiconductor fabrication, for example, but not limited to, CVD, PECVD, ALD, plasma-enhanced atomic layer deposition (PEALD), or other suitable methods. In some embodiments, the spacer layer may include, for example, but not limited to, silicon oxide, silicon nitride, silicon carbide, silicon oxycarbide, silicon oxynitride, silicon carbonitride, silicon oxycarbonitride, or combinations thereof.

The first via contacts 18 are formed in the first ILD layer 12 by, for example, but not limited to, a single damascene process, so as to electrically connect the S/D regions 11, respectively. In some embodiments, formation of the first via contacts 18 includes the following steps. First, via openings are formed through the first ILD layer 12 to expose the S/D regions 11 from the via openings, respectively. That is, the via openings extend from a top surface of the first ILD layer 12 to top surfaces of the S/D regions 11. After the via openings are formed, the first via contacts 18 are formed in the first ILD layer 12 by depositing a metallic material to fill the via openings and then removing excess of the metallic material by a planarization technique, such as chemical mechanical planarization (CMP). In some embodiments, the metallic material may include, for example, but not limited to, cobalt, tungsten, copper, titanium, tantalum, aluminum, zirconium, hafnium, or combinations thereof. In some embodiments, deposition of the metallic material may be conducted by a suitable technique known to those skilled in the art of semiconductor fabrication, for example, but not limited to, CVD, PECVD, ALD, PEALD, plating, or other suitable deposition techniques.

The MCESL 19 may be formed on the first ILD layer 12 by a suitable deposition process known to those skilled in the art of semiconductor fabrication, for example, but not limited to, CVD, PVD, ALD, HDPCVD, MOCVD, RPCVD, PECVD, or LPCVD, so as to cover the first via contacts 18, the sidewall spacers 17, the SAC layer 16, and the first ILD layer 12. In some embodiments, the MCESL 19 includes silicon nitride, silicon nitride doped with carbon, silicon oxide, silicon oxynitride, silicon oxynitride doped with carbon, amorphous carbon material, silicon carbide, other nitride materials, other carbide materials, aluminum oxide, other oxide materials, other metal oxides, boron nitride, boron carbide, and other low-k dielectric materials or low-k dielectric materials doped with one or more of carbon, nitrogen, and hydrogen, or other suitable materials. The MCESL 19 may include a dielectric material which is the same as or different from that of the SAC layer 16.

The second ILD layer 20 is formed on the MCESL 19 by a suitable deposition process known to those skilled in the art of semiconductor fabrication, for example, but not limited to, CVD, PVD, ALD, HDPCVD, MOCVD, RPCVD, PECVD, or LPCVD.

The second ILD layer 20 may include dielectric materials, such as silicon oxide, silicon nitride, silicon oxynitride, SOG, amorphous fluorinated carbon, FSG, carbon doped silicon oxide (e.g., SiCOH), Black Diamond® (Applied Materials Inc., Santa Clara, Calif.), Xerogel, Aerogel, polyimide, Parylene, BCB, Flare, SiLK (Dow Chemical Co., Midland, Mich.), non-porous materials, porous materials, or combinations thereof. In some embodiments, the second ILD layer 20 may include a HDP dielectric material (e.g., HDP oxide), a HARP dielectric material (e.g., HARP oxide), or a combination thereof. In some embodiments, the second ILD layer 20 may be a planarized dielectric film. The second ILD layer 20 may include a dielectric material which is the same as or different from that of the first ILD layer 12.

Referring to FIG. 1, the method 100 then proceeds to block 102, where a trench is formed. Referring to the example illustrated in FIG. 4, a trench 21 is formed to extend through the second ILD layer 20, the MCESL 19, and the SAC layer 16 so that the conductive cap layer 15 is exposed through the trench 21. The trench 21 may be formed by patterning the second ILD layer 20, the MCESL 19, and the SAC layer 16 using one or more etching processes (for example, but not limited to, a dry etching process) through a pattern opening of a patterned photoresist layer (not shown). The etching process may be conducted using an oxygen-containing etchant gas, and the conductive cap layer 15 is exposed to atmosphere through the trench 21 after the etching process. Therefore, a top portion of the conductive cap layer 15, which includes a metal (for example, but not limited to, tungsten (W)) or a metal alloy (for example, but not limited to, cobalt tungsten (CoW)) as described above, may be oxidized to form a metal oxide layer 151 on a remaining portion 152 of the conductive cap layer 15.

Referring to FIG. 1, the method 100 then proceeds to block 103, where a soft ashing process is conducted using a processing gas containing nitrogen gas. Referring to the examples illustrated in FIGS. 4 and 5, a soft ashing process is conducted using a processing gas containing nitrogen gas to remove the patterned photoresist layer and to convert the metal oxide layer 151 formed on the remaining portion 152 of the conductive cap layer 15 to a metal oxynitride layer 151'.

In some embodiments, the processing gas used for the soft ashing process is a gas mixture including nitrogen gas and hydrogen gas. In some embodiments, the content of nitrogen gas in the gas mixture ranges from about 30% to about 75%. When the content of nitrogen gas in the gas mixture is too low, such as lower than about 30%, the content of nitrogen in the metal oxynitride layer 151' thus formed is too low. On the other hand, when the content of nitrogen gas in the gas mixture is too high, such as greater than about 75%, the content of nitrogen in the metal oxynitride layer 151' thus formed may not be further increased due to saturation of the content of nitrogen in the metal oxynitride layer 151'. In some embodiments, the content of nitrogen gas in the gas mixture ranges from about 50% to about 70%. In some embodiments, the soft ashing process may be conducted at a temperature ranging from about 90° C. to about 320° C.

When the temperature is too low (such as lower than about 90° C.) or too high (such as higher than about 320° C.), the plasma for conducting the soft ashing process can not be generated. In some embodiments, the temperature ranges from about 195° C. to about 205° C. In some embodiments, the soft ashing process may be conducted at a pressure ranging from about 0.6 mTorr to about 3 Torr. When the pressure is too low (such as lower than about 0.6 mTorr) or too high (such as higher than about 3 Torr), the plasma for conducting the soft ashing process can not be generated. In some embodiments, the pressure ranges from about 0.7 mTorr to about 0.9 mTorr. In some embodiments, the soft ashing process may be conducted at a power of greater than about 0 W and up to about 3000 W. When the power is too high (such as higher than about 3000 W), the machine for generating the plasma for conducting the soft ashing process can not be operated. In some embodiments, the power ranges from about 2600 W to about 2800 W.

As described above, the metal oxide layer 151 is converted to the metal oxynitride layer 151' by the soft ashing process using the processing gas containing the nitrogen gas. In some embodiments, the metal oxynitride layer 151' has a thickness ranging from about 1 angstrom (Å) to about 2 Å, and includes a composition represented by $M_xO_yN_z$, wherein M is selected from tungsten (W), cobalt (Co), or a combination thereof, x is in a range from 66.0 atomic % to about 69.0 atomic %, y is in a range from about 17.0 atomic % to 22.0 atomic %, z is in a range from about 10.0 atomic % to 16.0 atomic %, and a total of x, y, and z is 100 atomic %. In some embodiments, the metal oxynitride layer 151' has a composition represented by $W_xO_yN_z$, wherein x is in a range from 67.0 atomic % to about 68.0 atomic %, y is in a range from about 17.5 atomic % to 21.5 atomic %, z is in a range from about 11.0 atomic % to 15.5 atomic %, and a total of x, y, and z is 100 atomic %. In some embodiments, the metal oxynitride layer 151' has a composition represented by $W_xO_yN_z$, wherein x is in a range from 67.2 atomic % to about 67.9 atomic %, y is in a range from about 17.8 atomic % to 21.3 atomic %, z is in a range from about 11.1 atomic % to 15.0 atomic %, and a total of x, y, and z is 100 atomic %.

Figure 10:
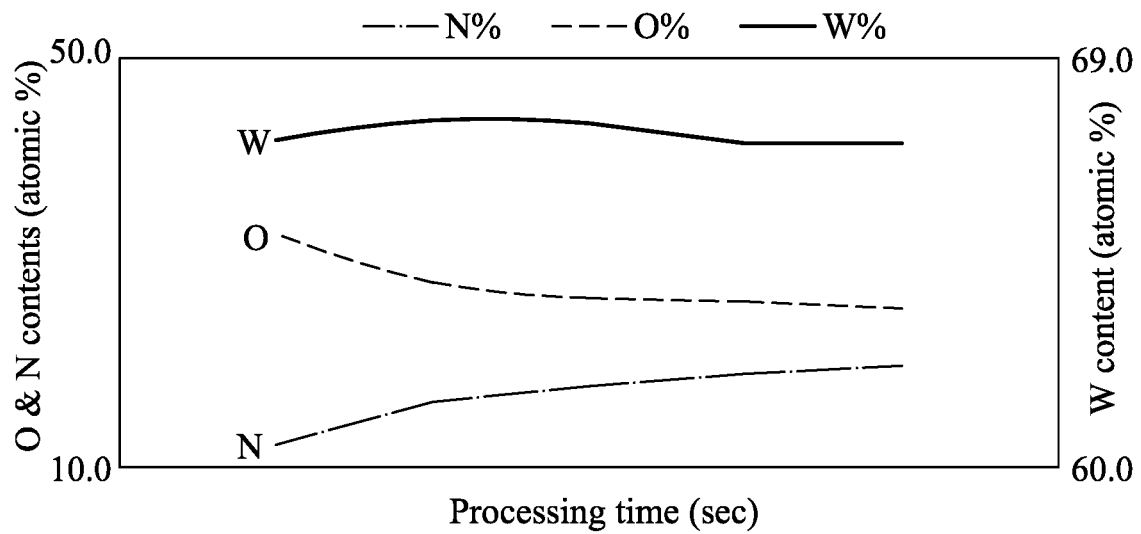
FIG. 10 illustrates plots of nitrogen, oxygen, and tungsten contents of a tungsten oxynitride layer formed on a tungsten layer (a conductive cap layer) versus a processing time of a soft ashing process performed using a gas mixture including nitrogen gas and hydrogen gas.

FIG. 10 illustrates plots of nitrogen, oxygen, and tungsten contents of a tungsten oxynitride layer (an example of the metal oxynitride layer 151') formed on a tungsten layer (an example of the remaining portion 152 of the conductive cap layer 15) versus a processing time of the soft ashing process performed using the gas mixture including the nitrogen gas and the hydrogen gas. The plots are obtained from an X-ray photoelectron Spectroscopy (XPS) analysis. As shown in FIG. 10, the oxygen content in the tungsten oxynitride layer is gradually decreased, the nitrogen content in the tungsten oxynitride layer is gradually increased, and the tungsten content in the tungsten oxynitride layer is maintained at a substantial constant value over the processing time of the soft ashing process for converting a tungsten oxide layer (an example of the metal oxide layer 151) to the tungsten oxynitride layer. This result indicates that oxygen contained in the tungsten oxide layer is gradually substituted with nitrogen during the soft ashing process using the gas mixture including the nitrogen gas and the hydrogen gas, so that the tungsten oxide layer is converted to the tungsten oxynitride layer.

Referring to FIG. 1, the method 100 then proceeds to block 104, where a wet cleaning process is conducted. Referring to the example illustrated in FIG. 5, a wet cleaning process is conducted to remove any residual contaminant material on the semiconductor device 1 after the etching process and the soft ashing processes. In some embodiments, a solution such as an SC-1 or SC-2 cleaning solution may be utilized, although other solutions, such as a mixture of $H_2SO_4$ and $H_2O_2$ (known as SPM), or a solution of hydrogen fluoride (HF), may alternatively be utilized. Any suitable solution that may be used to remove the residual contaminant material on the semiconductor device 1 after the etching process and the soft ashing processes are fully intended to be included within the scope of the disclosure. Since a bonding force between the metal oxynitride layer 151' and the remaining portion 152 of the conductive cap layer 15 is relatively high compared to that between the metal oxide layer 151 and the remaining portion 152 of the conductive cap layer 15, the metal oxynitride layer 151' can be bonded to the remaining portion 152 of the conductive cap layer 15 more firmly so as to serve as a protective layer to suppress the remaining portion 152 of the conductive cap layer 15 to be further oxidized and to prevent the remaining portion 152 of the conductive cap layer 15 from damage during the wet cleaning process.

Referring to FIG. 1, the method 100 then proceeds to block 105, where a second via contact is formed. Referring to the examples illustrated in FIGS. 5 and 6, a second via contact 22 is formed by a depositing a metallic material to fill the trench 21 using a deposition process, such as ALD, and then removing excess of the metallic material by a planarization technique, such as CMP. In some embodiments where ALD is used to form the second via contact 22, at least one metal-containing precursor and at least one reducing gaseous reactant are introduced into a processing chamber. In some embodiments, the metal-containing precursor includes a fluorine-free metal precursor. Examples of the fluorine-free metal precursor include, for example, but not limited to, a fluorine-free tungsten precursor. Examples of the fluorine-free tungsten precursor include, for example, but not limited to, tungsten chlorides, such as $WCl_2$, $WCl_4$, $WCl_5$, $WCl_6$, or combinations thereof. In some embodiments, the reducing gaseous reactant includes a hydrogen-containing chemical, such as silane, disilane, diborane, or combinations thereof. In some embodiments, the hydrogen-containing chemical may be introduced into the processing chamber together with another gas, such as hydrogen gas. In some embodiments where a plasma is used in ALD, processing gases including the metal-containing precursor (for example, tungsten chloride) and the reducing gaseous reactant may be transformed to plasma comprising ionized chemical species. Therefore, the metal oxynitride layer 151' formed on the remaining portion 152 of the conductive cap layer 15 is removed by a reaction of the metal oxynitride layer 151' with, for example, chloride ions comprised in the plasma, and the second via contact 22 (for example, a tungsten plug) is formed by a reaction of the metal-containing precursor (for example, tungsten chloride) and the reducing gaseous reactant (for example, the hydrogen-containing chemical). A planarization technique, such as CMP may be conducted to remove excess of the metallic material on the second ILD layer 20.

Figure 7:
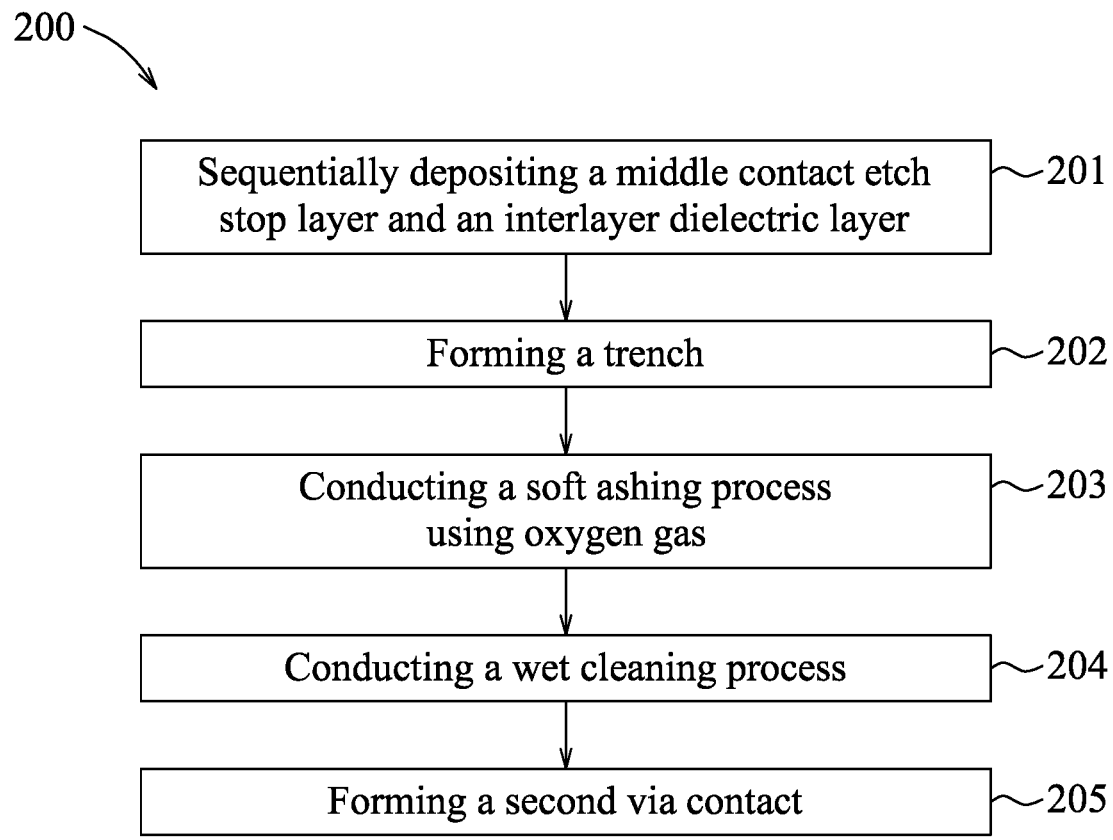
FIG. 7 is a flow diagram illustrating a method for manufacturing a semiconductor device in accordance with some embodiments.
Figure 8:
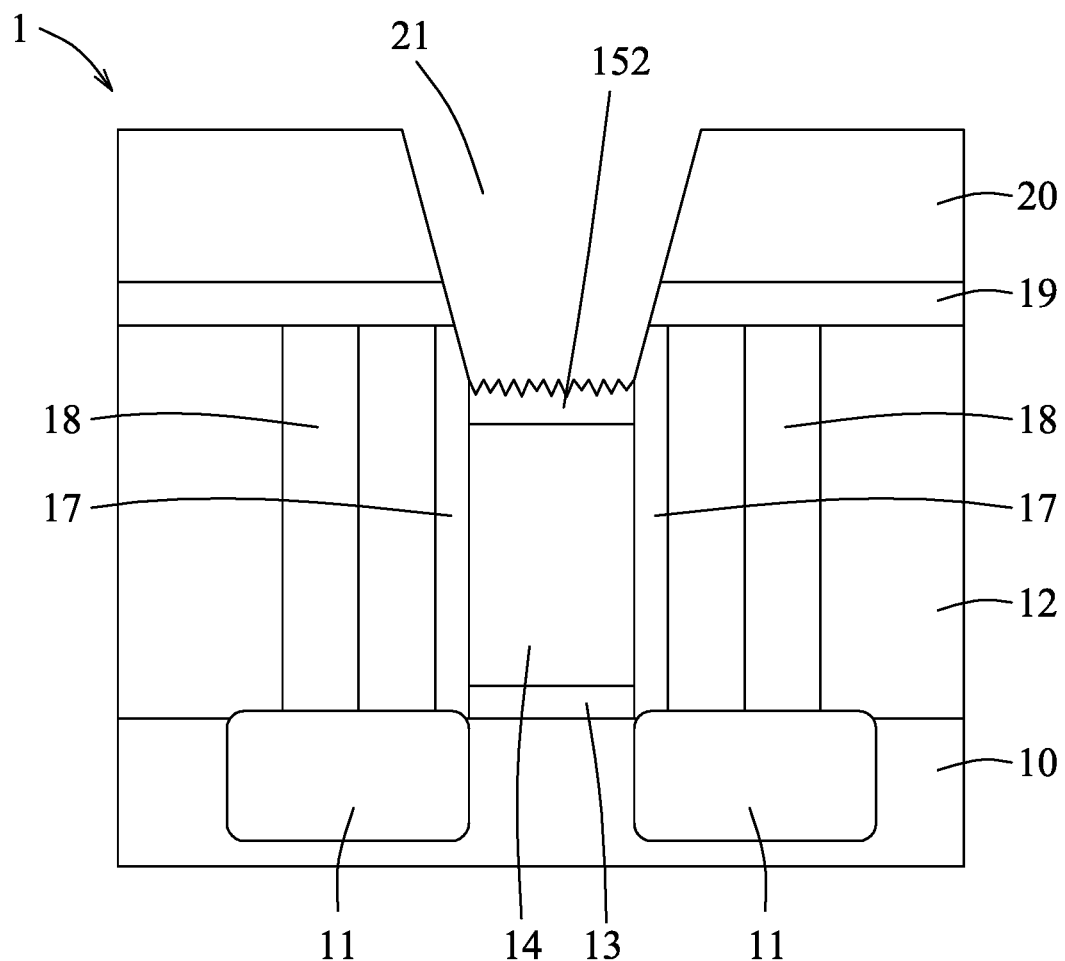
FIGS. 8 and 9 illustrate schematic views showing intermediate stages of the method depicted in FIG. 7.
Figure 9:
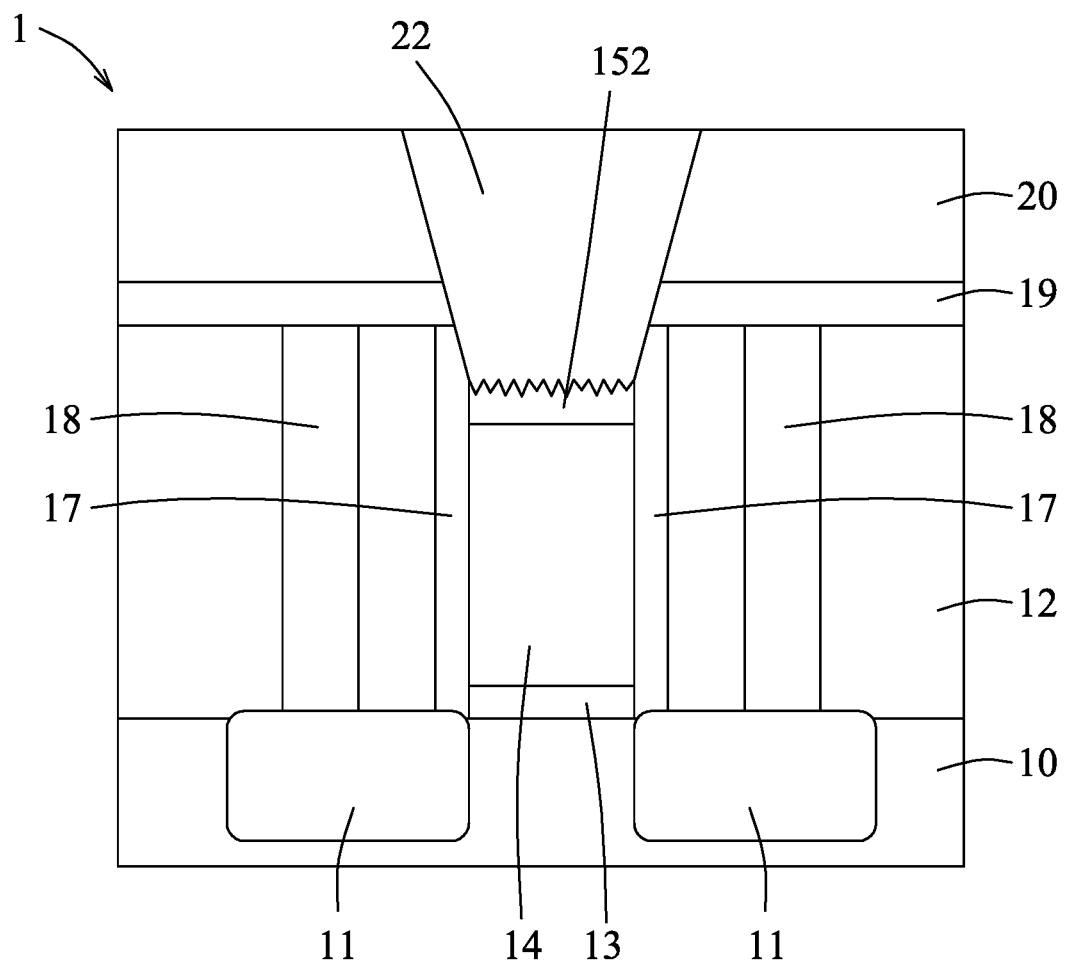

FIG. 7 illustrates a method 200 for manufacturing a semiconductor device in accordance with some embodiments. FIGS. 8 and 9 illustrate schematic views of a semiconductor device 2 during some stages of the method 200 shown in FIG. 7. The method 200 and the semiconductor device 2 are collectively described below. However, additional steps can be provided before, after or during the various stages of the method 200, and some of the steps described herein may be replaced by other steps or be eliminated. Similarly, further additional features may be present in the semiconductor device 2, and/or features present may be replaced or eliminated in additional embodiments.

Referring to FIG. 7, the method 200 begins at block 201, where a middle contact etch stop layer (MCESL) and an interlayer dielectric (ILD) layer are deposited sequentially. Details regarding the sequential deposition of the MCESL and the ILD layer are the same as or similar to those described above with reference to FIGS. 2 and 3.

Referring to FIG. 7, the method 200 then proceeds to block 202, where a trench is formed. Details regarding the formation of the trench are the same as or similar to those described above with reference to FIG. 4.

Referring to FIG. 7, the method 200 then proceeds to block 203, where a soft ashing process is conducted using oxygen gas. Referring to the example illustrated in FIG. 4, a top portion of the remaining portion 152 of the conductive cap layer 15 may be further oxidized due to use of the oxygen gas in the soft ashing process, so that the thickness of the metal oxide layer 151 may be further increased after the soft ashing process using the oxygen gas.

Referring to FIG. 7, the method 200 then proceeds to block 204, where a wet cleaning process is conducted. Details regarding the wet cleaning process are the same as or similar to those described above. The bonding force between the metal oxynitride layer 151' and the remaining portion 152 of the conductive cap layer 15 is relatively high compared to that between the metal oxide layer 151 and the remaining portion 152 of the conductive cap layer 15, as described above. In other words, the bonding force between the metal oxide layer 151 and the remaining portion 152 of the conductive cap layer 15 is relatively weak. In addition, the metal oxide layer 151 is fragile. Therefore, the metal oxide layer 151 may be stripped easily during the wet cleaning process, and may not serve as a protective layer to suppress further oxidation of the remaining portion 152 of the conductive cap layer 15 and to prevent the remaining portion 152 of the conductive cap layer 15 from damage during the wet cleaning process. Referring to the example illustrated in FIG. 8, the conductive cap layer 15 that remains after the wet cleaning process (i.e., the remaining portion 152 thereof) may have a rough surface.

Figure 11:
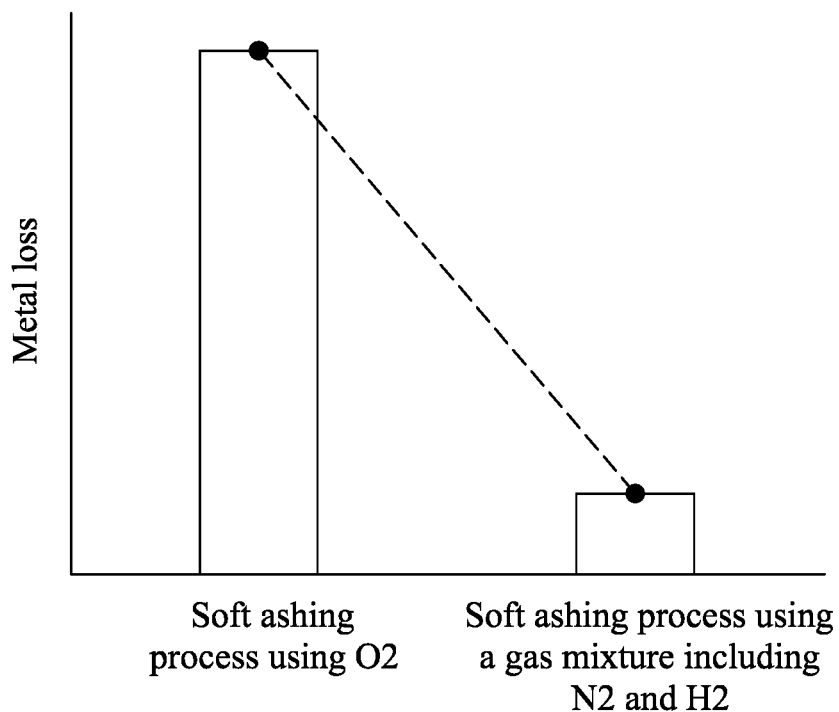
FIG. 11 illustrates a plot showing comparison of metal loss between a conducive cap layer subjected to a soft ashing process using oxygen gas and a conductive cap layer subjected to a soft ashing process using a gas mixture including nitrogen gas and hydrogen gas.

In addition, FIG. 11 illustrates a plot showing comparison of metal loss between a conductive cap layer subjected to a soft ashing process using oxygen gas and a conductive cap layer subjected to a soft ashing process using a gas mixture including nitrogen gas and hydrogen gas, after a wet cleaning process. As shown in FIG. 11, after the wet cleaning process, the metal loss of the conductive cap layer subjected to the soft ashing process using the gas mixture including nitrogen gas and hydrogen gas is significantly alleviated compared to the metal loss of the conductive cap layer subjected to the soft ashing process using oxygen gas. In some embodiments, after the wet cleaning process, a difference in thickness between the conductive cap layer subjected to the soft ashing process using the gas mixture including nitrogen gas and hydrogen gas and the conductive cap layer subjected to the soft ashing process using oxygen gas is at least 5 Å.

Referring to FIG. 7, the method 200 then proceeds to block 205, where a second via contact is formed. Details regarding the formation of the second via contact is the same as or similar to those described above with reference to FIG. 6.

As described above, in the present disclosure, the soft ashing process using the processing gas containing nitrogen gas is conducted to convert the metal oxide layer 151 of the conductive cap layer 15 to the metal oxynitride layer 151'. Since the bonding force between the metal oxynitride layer 151' and the remaining portion 152 of the conductive cap layer 15 is relatively high compared to that between the metal oxide layer 151 and the remaining portion 152 of the conductive cap layer 15, the metal oxynitride layer 151' thus formed on the remaining portion 152 of the conductive cap layer 15 may serve as a protective layer to suppress further oxidation of the remaining portion 152 of the conductive cap layer 15 and to prevent the remaining portion 152 of the conductive cap layer 15 from damage during the wet cleaning process. Therefore, the metal loss of the conductive cap layer 15 may be alleviated significantly and the second via contact 22 may be formed better.

In accordance with some embodiments of the present disclosure, a method for making a semiconductor device includes patterning at least one dielectric layer disposed over a conductive cap layer to form a via opening penetrating through the at least one dielectric layer to expose the conductive cap layer and to form a top portion of the conductive cap layer into a metal oxide layer; converting the metal oxide layer to a metal oxynitride layer by a soft ashing process using a processing gas containing nitrogen gas; removing the metal oxynitride layer from a remaining portion of the conductive cap layer; and forming a via contact in the via opening to electrically connect the remaining portion of the conductive cap layer.

In accordance with some embodiments of the present disclosure, the processing gas is a gas mixture including nitrogen gas and hydrogen gas.

In accordance with some embodiments of the present disclosure, a content of nitrogen gas in the gas mixture ranges from about 30% to about 75%.

In accordance with some embodiments of the present disclosure, the metal oxynitride layer has a thickness ranging from about 1 Å to about 2 Å.

In accordance with some embodiments of the present disclosure, the metal oxynitride layer includes a composition represented by $M_xO_yN_z$, wherein M is selected from tungsten (W), cobalt (Co), or a combination thereof, x is in a range from about 66.0 atomic % to about 69.0 atomic %, y is in a range from about 17.0 atomic % to about 22.0 atomic %, z is in a range from about 10.0 atomic % to about 16.0 atomic %, and a total of x, y, and z is 100 atomic %.

In accordance with some embodiments of the present disclosure, the soft ashing process is conducted at a temperature ranging from about 90° C. to about 320° C.

In accordance with some embodiments of the present disclosure, the soft ashing process is conducted at a pressure ranging from about 0.6 mTorr to about 3 Torr.

In accordance with some embodiments of the present disclosure, the soft ashing process is conducted at a power ranging of greater than about 0 W and up to about 3000 W.

In accordance with some embodiments of the present disclosure, removing the metal oxynitride layer and forming the via contact are conducted simultaneously by atomic layer deposition process using a metal-containing precursor.

In accordance with some embodiments of the present disclosure, a method for making a semiconductor device includes: patterning at least one dielectric layer disposed over a conductive cap layer formed on a metal gate of a transistor to form a via opening penetrating through the at least one dielectric layer to expose the conductive cap layer and to form a top portion of the conductive cap layer into a metal oxide layer; converting the metal oxide layer to a metal oxynitride layer by a soft ashing process using a processing gas containing nitrogen gas; removing the metal oxynitride layer from a remaining portion of the conductive cap layer; and forming a via contact in the via opening to electrically connect the remaining portion of the conductive cap layer.

In accordance with some embodiments of the present disclosure, the processing gas is a gas mixture including nitrogen gas and hydrogen gas.

In accordance with some embodiments of the present disclosure, a content of nitrogen gas in the gas mixture ranges from about 30% to about 75%.

In accordance with some embodiments of the present disclosure, the metal oxynitride layer has a thickness ranging from about 1 Å to about 2 Å.

In accordance with some embodiments of the present disclosure, the metal oxynitride layer includes a composition represented by $M_xO_yN_z$, wherein M is selected from tungsten (W), cobalt (Co), or a combination thereof, x is in a range from about 66.0 atomic % to about 69.0 atomic %, y is in a range from about 17.0 atomic % to about 22.0 atomic %, z is in a range from about 10.0 atomic % to about 16.0 atomic %, and a total of x, y, and z is 100 atomic %.

In accordance with some embodiments of the present disclosure, removing the metal oxynitride layer and forming the via contact are conducted simultaneously by atomic layer deposition process using a metal-containing precursor.

In accordance with some embodiments of the present disclosure, a method for making a semiconductor device includes: sequentially depositing a middle contact etch stop layer and an interlayer dielectric layer over a conductive cap layer formed on a metal gate of a transistor; patterning the middle contact etch stop layer and the interlayer dielectric layer to form a via opening penetrating through the middle contact etch stop layer and the interlayer dielectric layer to expose the conductive cap layer and to form a top portion of the conductive cap layer into a metal oxide layer; converting the metal oxide layer to a metal oxynitride layer by a soft ashing process using a processing gas containing nitrogen gas; removing the metal oxynitride layer from a remaining portion of the conductive cap layer; and forming a via contact in the via opening to electrically connect the remaining portion of the conductive cap layer.

In accordance with some embodiments of the present disclosure, the processing gas is a gas mixture including nitrogen gas and hydrogen gas.

In accordance with some embodiments of the present disclosure, a content of nitrogen gas in the gas mixture ranges from about 30% to about 75%.

In accordance with some embodiments of the present disclosure, the metal oxynitride layer has a thickness ranging from about 1 Å to about 2 Å.

In accordance with some embodiments of the present disclosure, the metal oxynitride layer includes a composition represented by $M_xO_yN_z$, wherein M is selected from tungsten (W), cobalt (Co), or a combination thereof, x is in a range from about 66.0 atomic % to about 69.0 atomic %, y is in a range from about 17.0 atomic % to about 22.0 atomic %, z is in a range from about 10.0 atomic % to about 16.0 atomic %, and a total of x, y, and z is 100 atomic %.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for making a semiconductor device, comprising:
    patterning at least one dielectric layer disposed over a conductive cap layer, which includes an upper portion and a lower portion disposed below the upper portion and which is liable to oxidation in an oxygen-containing environment including an oxygen-containing etchant gas or an atmosphere, to form a via opening penetrating through the at least one dielectric layer to expose the upper portion of the conductive cap layer and to form the upper portion of the conductive cap layer into an oxidized metal portion;
    converting the oxidized metal portion to a metal portion including oxygen and nitrogen by a soft ashing process using a processing gas containing nitrogen gas;
    removing the metal portion including oxygen and nitrogen from the lower portion of the conductive cap layer; and
    forming a via contact in the via opening to electrically connect the lower portion of the conductive cap layer,
    wherein removing the metal portion including oxygen and nitrogen and forming the via contact are conducted simultaneously by an atomic layer deposition process using a metal-containing precursor and a reducing gaseous reactant, wherein the metal-containing precursor is a fluorine-free metal precursor.

2. The method according to claim 1, wherein the processing gas is a gas mixture including nitrogen gas and hydrogen gas.

3. The method according to claim 2, wherein a content of nitrogen gas in the gas mixture ranges from 30% to 75%.

4. The method according to claim 1, wherein the metal portion including oxygen and nitrogen includes a composition represented by $M_xO_yN_z$, wherein M is selected from tungsten (W), cobalt (Co), or a combination thereof, x is in a range from 66.0 atomic % to 69.0 atomic %, y is in a range from 17.0 atomic % to 22.0 atomic %, z is in a range from 10.0 atomic % to 16.0 atomic %, and a total of x, y, and z is 100 atomic %.

5. The method according to claim 1, wherein the soft ashing process is conducted at a temperature ranging from 90° C. to 320° C.

6. The method according to claim 1, wherein the soft ashing process is conducted at a pressure ranging from 0.6 mTorr to 3 Torr.

7. The method according to claim 1, wherein the soft ashing process is conducted at a power of greater than 0 W and up to 3000 W.

8. A method for making a semiconductor device, comprising:
    patterning at least one dielectric layer disposed over a conductive cap layer, which is formed on a metal gate of a transistor to include an upper portion and a lower portion disposed below the upper portion and which is liable to oxidation in an oxygen-containing environment including an oxygen-containing etchant gas or an atmosphere, so as to form a via opening penetrating through the at least one dielectric layer to expose the upper portion of the conductive cap layer and to form the upper portion of the conductive cap layer into an oxidized metal portion;

converting the oxidized metal portion to a metal portion including oxygen and nitrogen by a soft ashing process using a processing gas containing nitrogen gas;

removing the metal portion including oxygen and nitrogen from the lower portion of the conductive cap layer; and forming a via contact in the via opening to electrically connect the lower portion of the conductive cap layer, wherein removing the metal portion including oxygen and nitrogen and forming the via contact are conducted simultaneously by an atomic layer deposition process using a metal-containing precursor and a reducing gaseous reactant, wherein the metal-containing precursor is a fluorine-free metal precursor.

9. The method according to claim 8, wherein the processing gas is a gas mixture including nitrogen gas and hydrogen gas.

10. The method according to claim 9, wherein a content of nitrogen gas in the gas mixture ranges from about 30% to about 75%.

11. The method according to claim 8, wherein the metal portion including oxygen and nitrogen includes a composition represented by $M_xO_yN_z$, wherein M is selected from tungsten (W), cobalt (Co), or a combination thereof, x is in a range from 66.0 atomic % to 69.0 atomic %, y is in a range from 17.0 atomic % to 22.0 atomic %, z is in a range from 10.0 atomic % to 16.0 atomic %, and a total of x, y, and z is 100 atomic %.

12. A method for making a semiconductor device, comprising:

sequentially depositing a middle contact etch stop layer and an interlayer dielectric layer over a conductive cap layer, which is formed on a metal gate of a transistor to include an upper portion and a lower portion disposed below the upper portion and which is liable to oxidation in an oxygen-containing environment including an oxygen-containing etchant gas or an atmosphere;

patterning the middle contact etch stop layer and the interlayer dielectric layer to form a via opening penetrating through the middle contact etch stop layer and the interlayer dielectric layer to expose the upper portion of the conductive cap layer and to form the upper portion of the conductive cap layer into an oxidized metal portion;

converting the oxidized metal portion to a metal portion including oxygen and nitrogen by a soft ashing process using a processing gas containing nitrogen gas;

removing the metal portion including oxygen and nitrogen from the lower portion of the conductive cap layer; and forming a via contact in the via opening to electrically connect the lower portion of the conductive cap layer, wherein removing the metal portion including oxygen and nitrogen and forming the via contact are conducted simultaneously by an atomic layer deposition process using a metal-containing precursor and a reducing gaseous reactant, wherein the metal-containing precursor is a fluorine-free metal precursor.

13. The method according to claim 12, wherein the processing gas is a gas mixture including nitrogen gas and hydrogen gas.

14. The method according to claim 13, wherein a content of nitrogen gas in the gas mixture ranges from about 30% to about 75%.

15. The method according to claim 12, wherein the metal portion including oxygen and nitrogen includes a composition represented by $M_xO_yN_z$, wherein M is selected from tungsten (W), cobalt (Co), or a combination thereof, x is in a range from 66.0 atomic % to 69.0 atomic %, y is in a range from 17.0 atomic % to 22.0 atomic %, z is in a range from 10.0 atomic % to 16.0 atomic %, and a total of x, y, and z is 100 atomic %.

16. The method according to claim 1, wherein the fluorine-free metal precursor includes a fluorine-free tungsten precursor.

17. The method according to claim 16, wherein the fluorine-free tungsten precursor includes $WCl_2$, $WCl_4$, $WCl_5$, $WCl_6$, or combinations thereof.

18. The method according to claim 1, wherein the reducing gaseous reactant includes a hydrogen-containing chemical.

19. The method according to claim 18, wherein the hydrogen-containing chemical includes silane, disilane, diborane, or combinations thereof.

* * * * *